(12) United States Patent  (10) Patent No.: US 8,789,901 B2
Kuan  (45) Date of Patent: Jul. 29, 2014

(54) LOCKING ASSEMBLY AND COMMUNICATION APPARATUS USING SAME

(75) Inventor: Chang-Ming Kuan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 277 days.

(21) Appl. No.: 13/312,999

(22) Filed: Dec. 7, 2011

(65) Prior Publication Data

US 2013/0106261 A1  May 2, 2013

(30) Foreign Application Priority Data

Oct. 27, 2011 (TW) .................................. 100220181

(51) Int. Cl.
*A47B 81/00* (2006.01)

(52) U.S. Cl.
USPC .............. 312/223.2; 312/222; 70/85; 109/47; 361/679.57; 292/80; 292/87; 292/1

(58) Field of Classification Search
USPC ........ 312/215, 222, 223.1–223.2; 292/80–81, 292/83, 85, 87, 194–195, 200, 209, 1; 361/679.57, 679.58, 726; 109/47; 70/80–85
See application file for complete search history.

(56) References Cited

U.S. PATENT DOCUMENTS

| | | | | |
|---|---|---|---|---|
| 6,279,755 | B1* | 8/2001 | Bodensteiner et al. | 211/26 |
| D483,374 | S * | 12/2003 | Hung | D14/439 |
| 7,303,170 | B2* | 12/2007 | Fan et al. | 248/27.3 |
| 8,408,147 | B2* | 4/2013 | Holloway et al. | 109/56 |
| 8,570,751 | B2* | 10/2013 | Zhou | 361/726 |
| 2002/0017840 | A1* | 2/2002 | Huw-Ching et al. | 312/348.6 |
| 2004/0017651 | A1* | 1/2004 | Gan et al. | 361/685 |
| 2008/0247130 | A1* | 10/2008 | Chen | 361/685 |
| 2008/0266817 | A1* | 10/2008 | Li | 361/747 |
| 2011/0242768 | A1* | 10/2011 | Lu | 361/726 |
| 2012/0275104 | A1* | 11/2012 | Hamand et al. | 361/679.31 |
| 2012/0293975 | A1* | 11/2012 | Liang | 361/807 |
| 2013/0102179 | A1* | 4/2013 | Kuan | 439/327 |
| 2013/0162131 | A1* | 6/2013 | Zhou | 312/304 |
| 2013/0279123 | A1* | 10/2013 | Lin | 361/747 |

* cited by examiner

*Primary Examiner* — Darnell Jayne
*Assistant Examiner* — Ryan A Doyle
(74) *Attorney, Agent, or Firm* — Novak Druce Connolly Bove + Quigg LLP

(57) ABSTRACT

A communication apparatus includes a clapboard having a locking hole defined therein and forming part of a receiving portion, and a housing structure defining a latching hole opposite to the locking hole. A locking assembly is mounted to the housing structure and used to disengagably lock the housing structure in the receiving portion, and includes a locking part, a sliding part and a handle. The locking part is fixed to the housing structure and a sliding part including a resisting portion passing through the latching hole and the locking hole to engage with the communication apparatus. The sliding part is movably mounted in the housing structure and includes a resisting portion to engage with the latching portion. The handle slidably passes through the housing structure and is fixed to the sliding part.

19 Claims, 8 Drawing Sheets

LOCKING ASSEMBLY AND COMMUNICATION APPARATUS USING SAME

BACKGROUND

1. Technical Field

The present disclosure relates to communication apparatuses, and more particularly to a locking assembly to lock an electronic device in a communication apparatus.

2. Description of Related Art

Generally, many electronic devices incorporate modular components such as removable power supplies, removable hard disks and removable fans. Such components have been widely used in computers, servers, redundant arrays of independent disks (RAIDs), and other communication apparatuses. These electronic devices can, for example, supply enough and continuous electric power or enough and manageable data storage space. In addition, these electronic devices provide users the convenience of easily taking out or exchanging a power supply, a hard disk or a fan, for example.

A common kind of electronic device received in a housing structure is mounted in the communication apparatus by bolts or screws. When the electronic device needs to be taken out from the communication apparatus, the bolts or screws must firstly be removed. Therefore, it is inconvenient to install or remove the electronic device into or from the communication apparatus.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
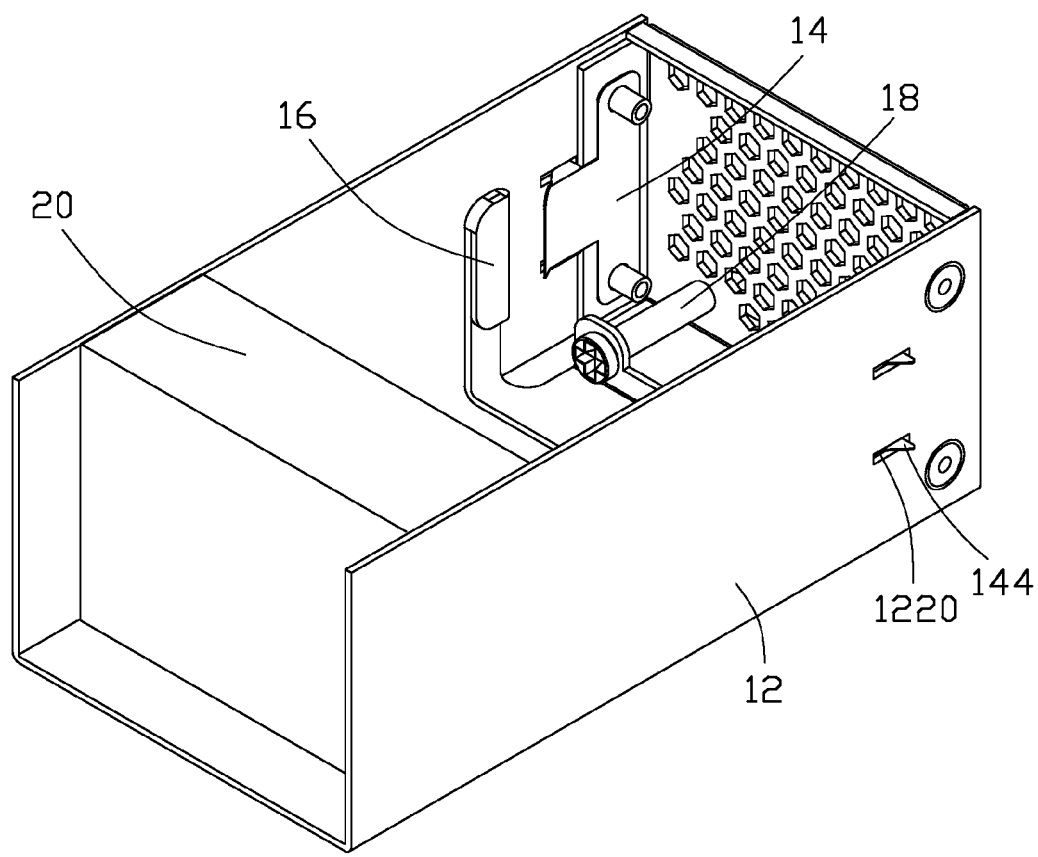
FIG. 1 is a perspective view of an exemplary embodiment of a locking assembly in accordance with the present disclosure, showing the locking assembly fixed to a housing structure, and an electronic device mounted in the housing structure.
Figure 2:
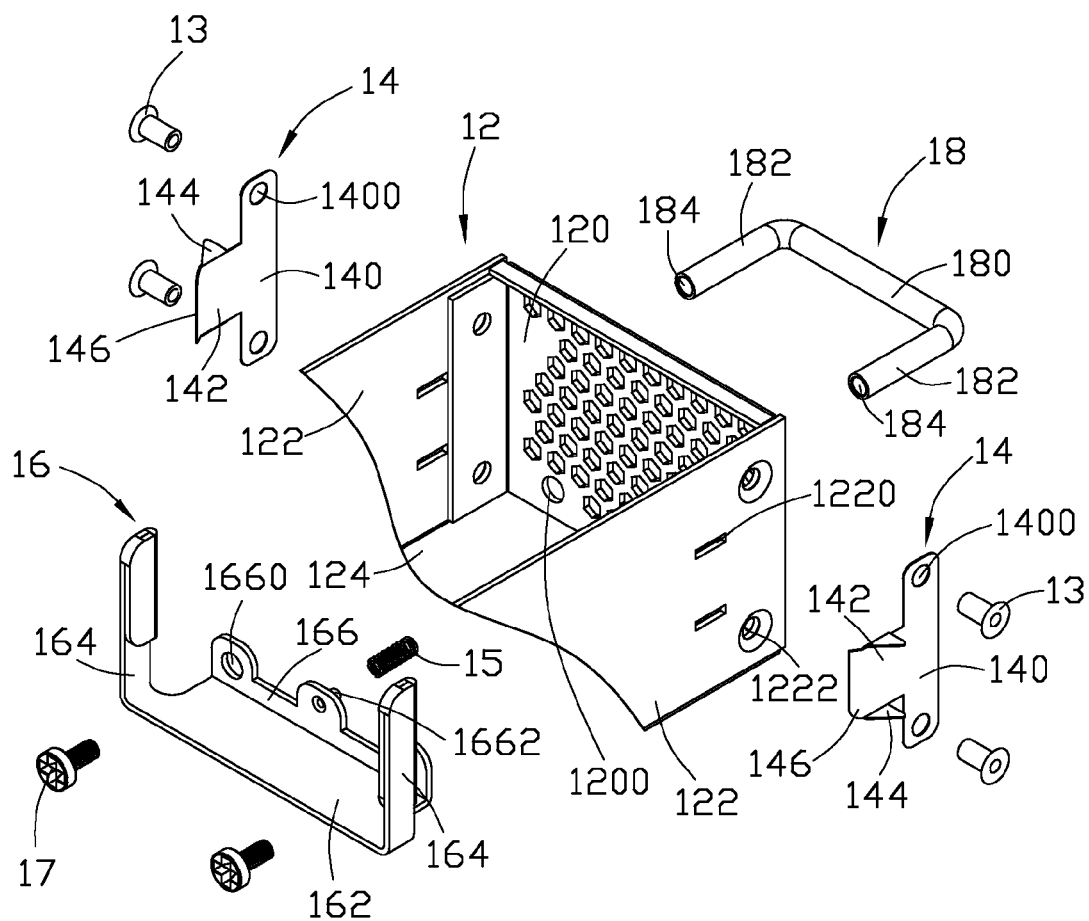
FIG. 2 is a disassembled view of the locking assembly of FIG. 1, also showing part of the housing structure.
Figure 3:
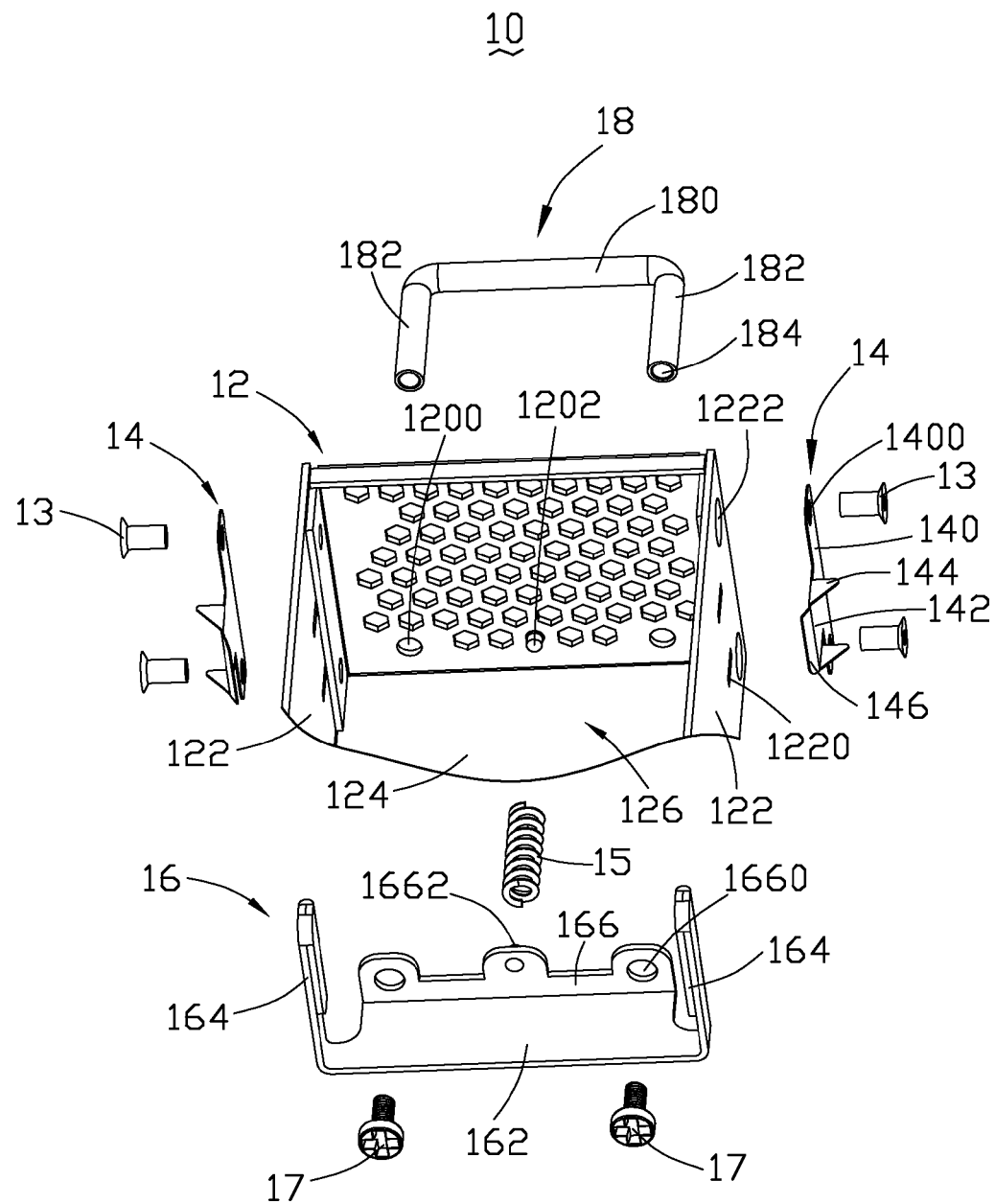
FIG. 3 is similar to FIG. 2, but showing the parts viewed from another aspect.

The disclosure is illustrated by way of example and not by way of limitation in the figures of the accompanying drawings. It should be noted that references to "an" or "one" embodiment in this disclosure are not necessarily to the same embodiment, and such references can mean "at least one."

Referring to FIGS. 1-3 and 7, a locking assembly 10 is used to lock an electronic device 20 in a communication apparatus 30, and to remove the electronic device 20 from the communication apparatus 30. In the illustrated embodiment, the electronic device 20 may be a removable power supply, a removable hard disk or a removable fan, which is used in computers, servers, redundant arrays of independent disks (RAIDs), and other communication apparatuses.

In particular, the electronic device 20 is accommodated in a housing structure 12, and the housing structure 12 is engaged with the locking assembly 10. The combination of the housing structure 12, the electronic device 20 and the locking assembly 10 is removably installed in the communication apparatus 30.

The locking assembly 10 comprises a pair of locking parts 14, a sliding part 16, and a handle 18. The pair of locking parts 14 and the sliding part 16 are mounted on the housing structure 12. The handle 18 is securely mounted on the sliding part 16 so that the sliding part 16 is driven to move in the housing structure 12 by pushing or pulling the handle 18.

The housing structure 12 comprises a front board 120, a pair of side boards 122, and a bottom board 124. The pair of side boards 122 perpendicularly extend from two sides of the bottom board 124 to be parallel with each other, and the front board 120 perpendicularly extends from an end of the bottom board 124 to interconnect the pair of side boards 122. Therefore, the front board 120, the pair of side boards 122 and the bottom board 124 collectively form a receiving space 126 to receive the electronic device 20. In the illustrated embodiment, the front board 120, the pair of side boards 122 and the bottom board 124 are integrally formed. In other embodiments, the front board 120, the pair of side boards 122 and the bottom board 124 are separately formed, and are then assembled together by a mechanical mounting method to form the housing structure 12.

The front board 120 defines a pair of first through holes 1200 to engagingly receive the handle 18, and comprises a first protruding portion 1202. The first protruding portion 1202 protrudes from the front board 120 into the receiving space 126, and is between the pair of first through holes 1200. Each of the pair of side boards 122 defines at least one latching hole 1220 and a plurality of first fixing holes 1222. The plurality of first fixing holes 1222 are provided at an end of the corresponding side board 122 contiguous with the front board 120, to enable one corresponding locking part 14 to be engaged with the side board 122. In the illustrated embodiment, each side board 122 defines two latching holes 1220. Each latching hole 1220 is substantially strip-shaped, i.e., a slot. The two latching holes 1220 are provided on a side of the plurality of first fixing holes 1222 away from the front board 120.

In other embodiments, the locking assembly 10 comprises only one locking part 14, and only one of the pair of side boards 122 of the housing structure 12 need define at least one latching hole 1220 to engagingly receive the locking part 14.

In still other embodiments, there may be only one latching hole 1220, or more than two latching holes 1220, per side board 122.

Each of the locking parts 14 comprises a fixing portion 140, a connecting portion 142, at least one latching portion 144, and a guiding portion 146. The fixing portion 140 and the guiding portion 146 are provided on two opposite front and rear sides of the connecting portion 142, respectively. In the illustrated embodiment, there are two latching portions 144. The latching portions 144 extend laterally outward from top and bottom sides of the connecting portion 142, respectively.

The fixing portion 140 defines a plurality of second fixing holes 1400, corresponding to the plurality of first fixing holes 1222 of the respective side board 122. A plurality of tightening parts (or fastening parts) 13, such as bolts, screws or rivets, pass through the corresponding first fixing holes 1222 and are engaged in the corresponding second fixing holes 1400, to securely fix the locking part 14 on the corresponding side board 122 in the receiving space 126. For example, when the tightening parts 13 are screws, the tightening parts 13 pass through the corresponding first fixing holes 1222 and are threadedly engaged in the corresponding second fixing holes 1400. The connecting portion 142 extends from and is coplanar with the fixing portion 140. In the illustrated embodiment, the connecting portion 142 and the fixing portion 140 cooperatively form a generally T-shaped configuration.

The latching portions 144 extend from the top and bottom sides of the connecting portion 142 towards and through the corresponding side board 122. In particular, each latching portion 144 comprises a bevel edge 1442. The bevel edge 1442 is inclined relative to the connecting portion 142, and extends away from the sliding part 16 to engage in the corresponding latching hole 1220. In the illustrated embodiment, each of the latching portions 144 is substantially triangle-shaped. In other embodiments, the at least one latching portion 144 is substantially trapezium-shaped. The guiding portion 146 obliquely extends from a rear of the connecting portion 142 in a direction away from the fixing portion 140. In particular, the guiding portion 146 is bent obliquely inward from the connecting portion 142, away from the corresponding side board 122. Thus, the guiding portion 146 and the pair of latching portions 144 are configured at two opposite outer and inner sides of the connecting portion 142, respectively.

In the illustrated embodiment, the fixing portion 140, the connecting portion 142, the at least one latching portion 144 and the guiding portion 146 are integrally formed as a single monolithic body of the same material. For example, the locking part 14 can be formed by stamping a continuous metal plate.

The number of latching holes 1220 of each side board 122 is equal to the number of latching portions 144 of each locking part 14. In the illustrated embodiment, the number is two. In other embodiments, the number can be only one, or three, or another desired number.

In assembly, the plurality of tightening parts 13 pass through the corresponding first fixing holes 1222 and are engaged in the corresponding second fixing holes 1400 to securely fix the locking parts 14 on the corresponding side boards 122. The latching portions 144 movably engage in the latching holes 1220, so that both the fixing portion 140 and the connecting portion 142 of each locking part 14 abut against the corresponding side board 122. Thereby, a gap is formed between the guiding portion 146 of the locking part 14 and the corresponding side board 122, to receive the sliding part 16 (this is described in more detail below).

Figure 4:
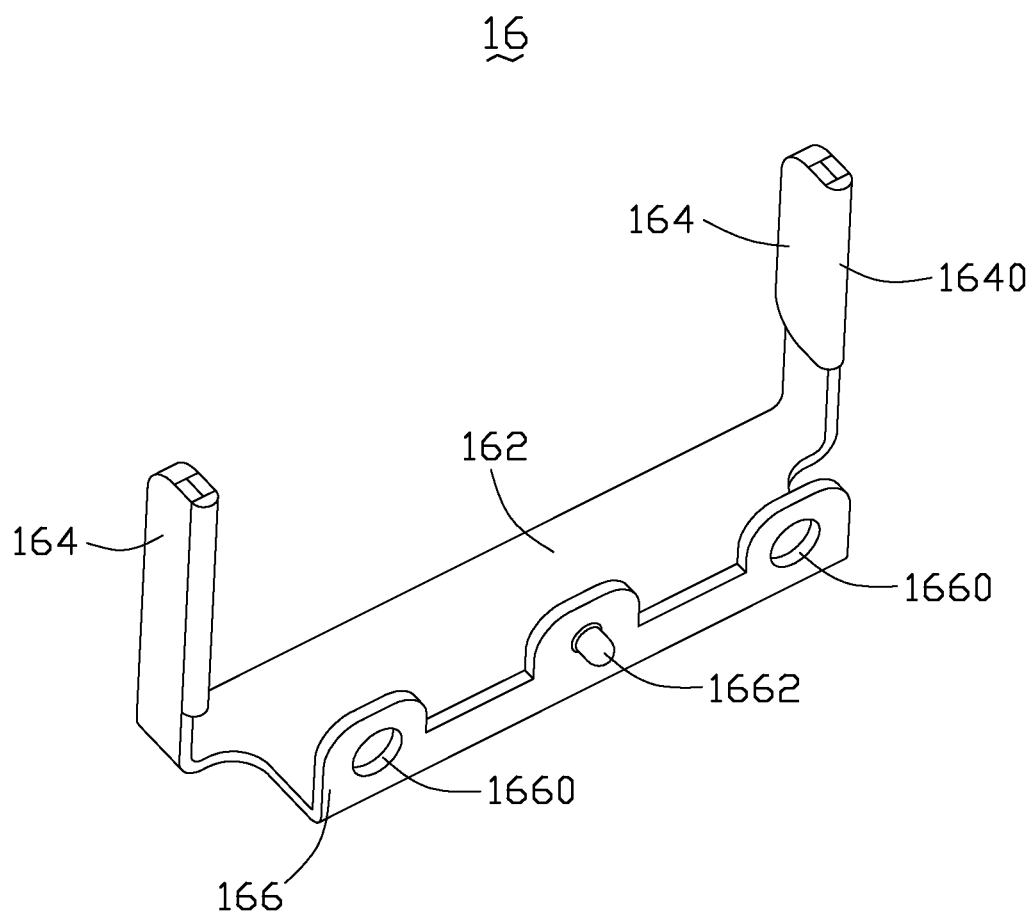
FIG. 4 is an enlarged perspective view of a sliding part of the locking assembly of FIG. 1.

Referring to FIG. 4, the sliding part 16 is movably mounted in the receiving space 126, and comprises a sliding portion 162, a pair of resisting portions 164 and an urging portion 166. The sliding portion 162 abuts against the bottom board 124 of the housing structure 12 such that the sliding part 16 can stably slide in the receiving space 126. The pair of resisting portions 164 are perpendicularly bent from two sides of the sliding portion 162, and abut against the corresponding side boards 122 in positions contiguous with the guiding portions 146 of the locking parts 14. Therefore, the pair of locking parts 14 is positioned between the front board 120 and the sliding part 16. Each of the pair of resisting portions 164 has a resisting surface 1640 facing the corresponding locking part 14. The resisting surface 1640 urges the bevel edge 1442 of the locking part 14 to elastically deform the locking part 14.

The urging portion 166 is perpendicularly bent from the sliding portion 162, is positioned generally between the pair of resisting portions 164, defines a pair of second through holes 1660, and comprises a second protruding portion 1662. The pair of second through holes 1660 are opposite to the pair of first through holes 1220, to provide for engagement of the sliding part 16 with the handle 18. The second protruding portion 1662 is positioned between the pair of second through holes 1660, and protrudes outwardly from the urging portion 166 towards the front board 120 to be opposite to the first protruding portion 1202.

In the illustrated embodiment, the sliding portion 162, the pair of resisting portions 164 and the urging portion 166 are integrally formed as a single monolithic body of the same material. For example, the sliding part 16 can be formed by stamping, pressing, bending and/or otherwise processing a continuous metal plate.

The handle 18 comprises a holding portion 180, and a pair of drawing poles 182 perpendicular bent from two opposite ends of the holding portion 180. A pair of screwing holes 184 is defined in ends of the drawing poles 182, respectively.

The locking assembly 10 further comprises an elastic element 15 to reposition the sliding part 16 to an original position. The elastic element 15 is mounted between the front board 120 and the sliding part 16 to elastically connect the sliding part 16 with the housing structure 12. For example, the elastic element 15 is a coil spring. Two ends of the elastic element 15 are fixed on the first protruding portion 1202 and the second protruding portion 1662, to elastically connect the sliding part 16 with the housing structure 12. In other embodiments, the elastic element 15 is a torsion spring or a leaf spring.

In assembly, the sliding part 16 is received in the receiving space 126, with the sliding portion 162 abutting against the bottom board 124, the pair of resisting portions 164 abutting against the corresponding side boards 122, and the urging portion 166 facing towards the front board 120. The pair of drawing poles 182 pass through the corresponding first through holes 1200 and the corresponding second through holes 1660 respectively. A pair of tightening screws 17 is screwed in the corresponding screwing holes 184 to securely mount the corresponding drawing poles 182 on the urging portion 166. Thereby, the handle 18 is firmly fixed on the sliding part 16.

Figure 5:
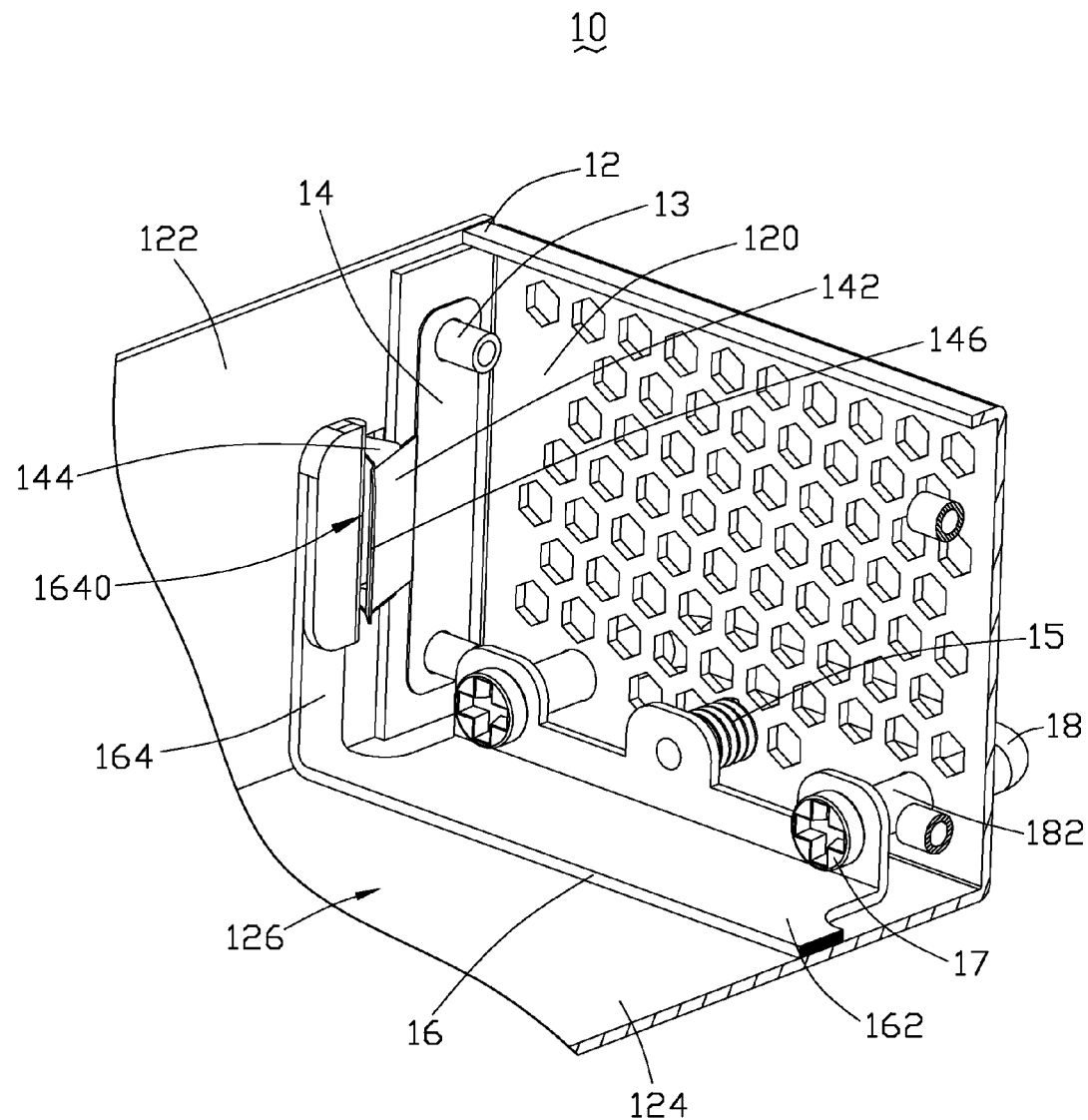
FIG. 5 is an enlarged cutaway view of the locking assembly and part of the housing structure of FIG. 1, showing the sliding part engaging with a locking part of the locking assembly.
Figure 6:
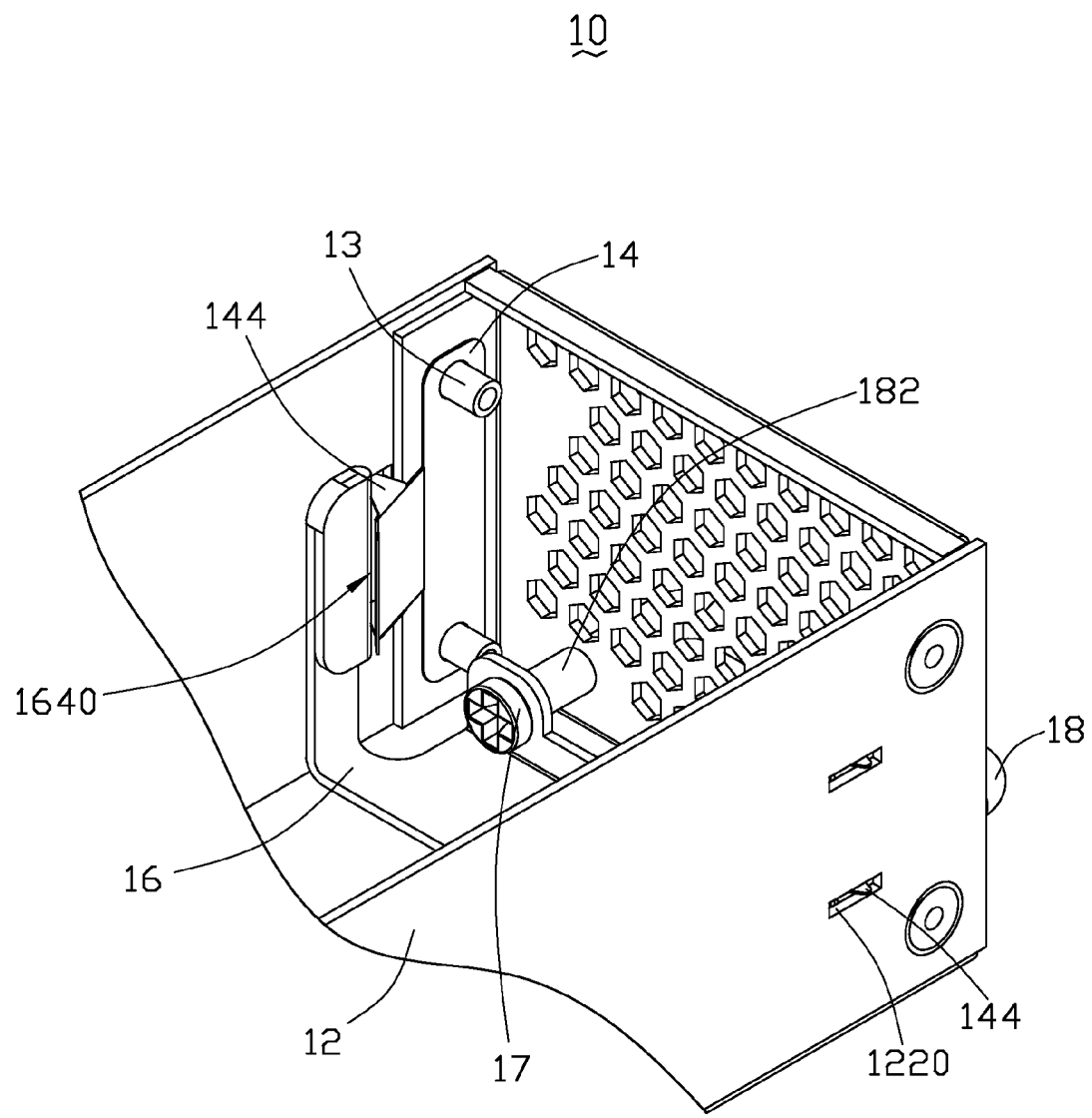
FIG. 6 is substantially similar to FIG. 5, but showing the sliding part more forwardly engaged with the locking part such that the locking part is urged to an unlocked position.

Referring to FIG. 5 and FIG. 6, in operation of the locking assembly 10, the holding portion 180 of the handle 18 is pulled by a user to drive the sliding part 16 to move towards the locking parts 14, with the pair of drawing poles 182 sliding in the corresponding first through holes 1200. Each resisting portion 164 moves towards the gap formed between the corresponding guiding portion 146 and the corresponding side board 122, and the resisting surface 1640 interferingly urges the bevel edges 1442. Thus the locking part 14 elastically deforms inward and the latching portions 144 withdraw inward toward and at least partly into the receiving space 126. In this process, free ends of the latching portions 144 may remain in the corresponding latching holes 1220, or the latching portions 144 may completely disengage from the corresponding latching holes 1220. In addition, the elastic element 15 is compressed.

As described above, when the two pairs of latching portions 144 are disengaged from the corresponding latching holes 1220 by the corresponding resisting portions 164 urging the latching portions 144, the elastic element 15 is compressed. Then when the user releases his/her pressure on the holding portion 180, the elastic element 15 decompresses and drives the sliding part 16 inward. The sliding part 16 is urged to move away from the locking parts 14, and the resisting portions 164 disengage from the corresponding latching portions 144, as shown in FIG. 1.

Figure 7:
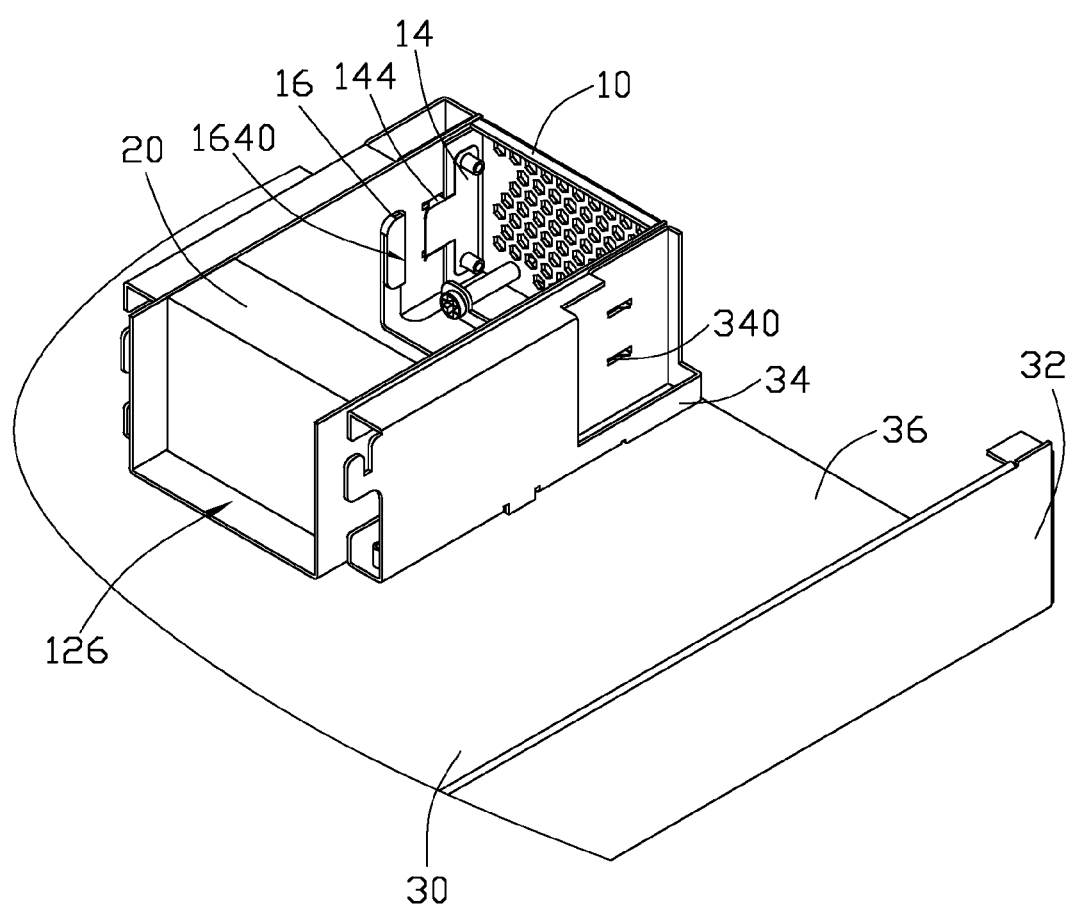
FIG. 7 is a perspective, cutaway view of an exemplary embodiment of part of a communication apparatus in accordance with the present disclosure, showing the housing structure with the electronic device and the locking assembly of FIG. 1 locked in the communication apparatus.
Figure 8:
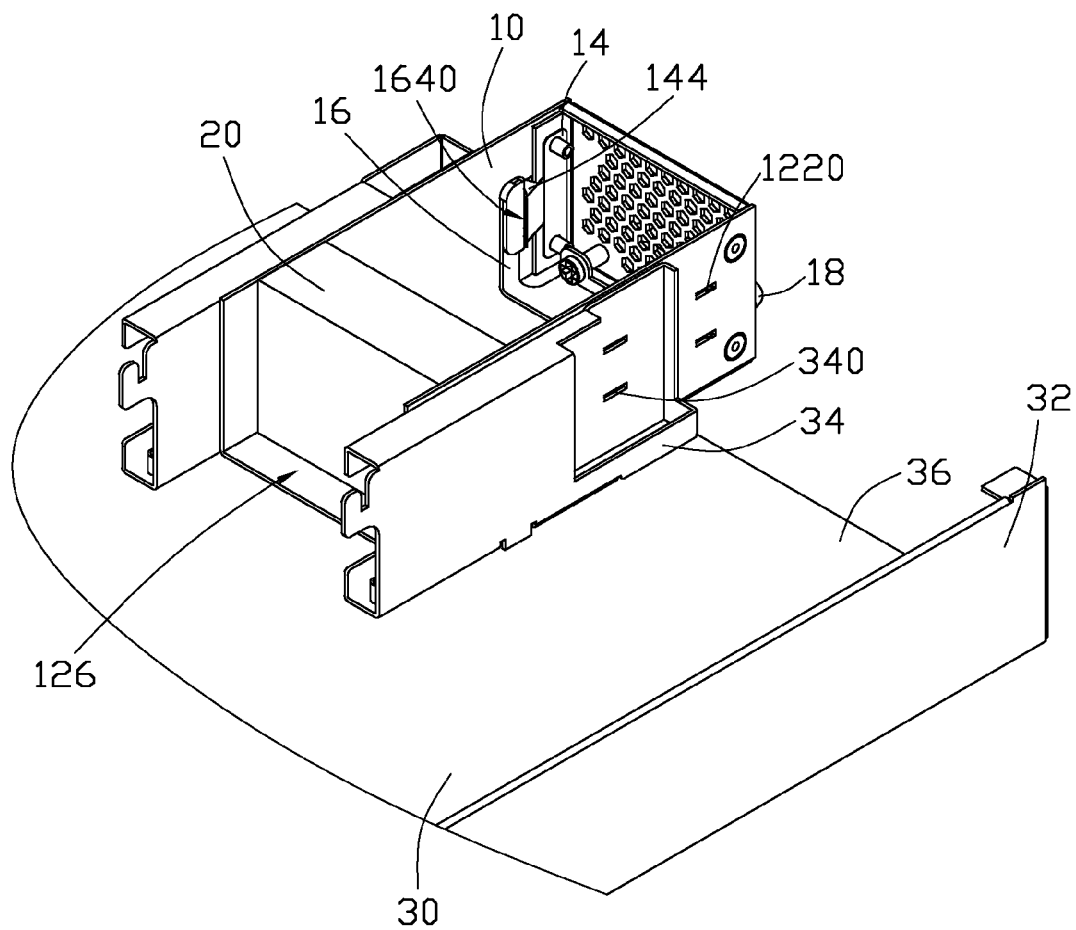
FIG. 8 is similar to FIG. 7, but showing the housing structure with the electronic device and the locking assembly unlocked from the communication apparatus and being removed from the communication apparatus.

Referring to FIG. 7 and FIG. 8, the locking assembly 10 is used to lock the electronic device 20 received in the receiving space 126 of the housing structure 12 onto the communication apparatus 30. The combination of the housing structure 12, the electronic device 20 and the locking assembly 10 is hereinafter sometimes referred to as a "removable module" (not labeled).

The communication apparatus 30 comprises an enclosure 32 and a plurality of clapboards 34. The clapboards 34 are mounted in the enclosure 32, and are spaced from each other to form a plurality of receiving portions (or receptacles) 36. Each of the receiving portions 36 is bordered on two sides by two clapboards 34, and is used to receive one respective removable module. Each of the clapboards 34 defines at least one locking hole 340 opposite to the at least one latching hole 1220 of a corresponding adjacent side board 122. In the present embodiment, each clapboard 34 defines two locking holes 340 in each of two opposite sides thereof. The latching portions 144 of the locking parts 14 of the housing structure 12 are latched into the corresponding latching holes 1220 and the corresponding locking holes 340 of two corresponding clapboards 34 to lock the housing structure 12 in a selected one of the receiving portions 36. Thereby, the electronic device 20 is securely mounted in the communication apparatus 30. In the present embodiment, at least two housing structures 12 with electronic devices 20 received therein can be parallelly mounted in the communication apparatus 30.

When the electronic device 20 needs to be removed from the communication apparatus 30, the handle 18 is pulled by a user to drive the sliding part 16 to move towards the locking parts 14. The resisting portions 164 enter the gaps between the guiding portions 146 and the corresponding side boards 122 and the resisting surfaces 1640 interferingly urge the corresponding bevel edges 1442 such that the latching portions 144 disengage from the corresponding locking holes 340. The elastic element 15 is thus compressed; and the housing structure 12 is then slid out from the receiving portion 36 to take the electronic device 20 out of the communication apparatus 30. Then when the user releases his/her pressure on the handle 18, the elastic element 15 decompresses and drives the sliding part 16 to move inward away from the locking parts 14. Thus the resisting portions 164 disengage from the guiding portions 146 and the elastic element 15 returns to an original uncompressed (natural) state.

When the electronic device 20 (which is received in the receiving space 126 of the housing structure 12) is to be mounted back into the communication apparatus 30, the handle 18 is pushed by the user to drive the sliding part 16 to move away from the locking parts 14 and to stretch the elastic element 15. The housing structure 12 is slid into the receiving portion 36 until the latching portions 144 are latched into the latching holes 1220 and the locking holes 340. Then when the user releases his/her pressure on the handle 18, the elastic element 15 recoils, and the sliding part 16 moves back part of the way towards the locking parts 14 until the elastic element 15 returns to an original unstretched (natural) state.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A locking assembly for locking a housing structure containing an electronic device in a communication apparatus, the housing structure defining at least one latching hole, and the locking assembly comprising:

a locking part, fixed to the housing structure and comprising at least one latching portion, a guiding portion, a fixing portion fixed on the housing structure, and a connecting portion between the guiding portion and the fixing portion, the at least one latching portion and the guiding portion being respectively configured at two opposite outer and inner side of the connecting portion, the at least one latching portion comprising an edge extending forwardly and outwardly from the housing structure, the at least one latching portion passing through the at least one latching hole to engage with the communication apparatus so as to lock the housing structure onto the communication apparatus, the guiding portion bending rearward and inward into an interior of the housing structure;

a sliding part, movably mounted in the housing structure and comprising a resisting portion rearward of the guiding portion, wherein the resisting portion comprises a resisting surface facing the locking part, the edge of the at least one latching portion is inclined relative to the connecting portion and extends away from the sliding part, and when the handle is pulled forward, the resisting surface urges the edge of the at least one latching portion to cause the locking part to elastically deform inward; and a handle, slidably passing through the housing structure and fixed to the sliding part;

wherein when the handle is pulled forward, the handle drives the sliding part towards the guiding portion of the locking part, the resisting portion urges the edge of the at least one latching portion and causes the locking part to elastically deform inward, and at least one latching portion thereby disengages from the communication apparatus such that the electronic device is removable from the communication apparatus.

2. The locking assembly of claim 1, wherein the housing structure comprises a bottom board and a pair of side boards perpendicularly extending from two sides of the bottom board to be parallel with each other, and the bottom board and the pair of side boards collectively form a receiving space to receive the electronic device.

3. The locking assembly of claim 2, wherein the sliding part further comprises a sliding portion abutting against the bottom board, and the resisting portion is perpendicularly bent from one side of the sliding portion and abuts against a corresponding one of the side boards in a position contiguous with the guiding portion, whereby the sliding part is stably slidable in the receiving space.

4. The locking assembly of claim 3, wherein the housing structure further comprises a front board perpendicularly extending from the bottom board to interconnect the pair of side boards, and the locking part is fixed to the corresponding one of the side boards between the front board and the sliding part.

5. The locking assembly of claim 4, wherein the front board defines a pair of first through holes, the sliding part further comprises an urging portion bent from the sliding portion to be parallel with the front board, the urging portion defines a pair of second through holes opposite to the corresponding first through holes, and the handle passes through the pair of first through holes and the pair of second through holes and is securely mounted on the urging portion.

6. The locking assembly of claim 5, further comprising an elastic element received in the receiving space and connected between the front board and the sliding part to elastically connect the housing structure with the sliding part.

7. The locking assembly of claim 6, wherein the front board comprises a first protruding portion protruding into the receiving space, the urging portion comprises a second protruding portion protruding towards the front board, and two ends of the elastic element are respectively fixed on the first protruding portion and the second protruding portion.

8. A communication apparatus, comprising:
a clapboard having a locking hole defined therein;
a receiving portion, the clapboard forming part of the receiving portion; and
a housing structure, received in the receiving portion and defining a latching hole opposite to the locking hole; and
a locking assembly mounted to the housing structure and used to disengagably lock the housing structure in the receiving portion, the locking assembly comprising:
a locking part, fixed to the housing structure and comprising a latching portion passing through the latching hole and the locking hole to engage with the clapboard, wherein a fixing portion is fixed on the housing structure, a connecting portion, and a guiding portion, the connecting portion is between the fixing portion and the guiding portion, and the guiding portion bends from the connecting portion in a direction away from the latching portion;
a sliding part, movably mounted in the housing structure and comprising a resisting portion to engage with the latching portion, wherein the resisting portion comprises a resisting surface facing the locking part, the latching portion bends towards an exterior of the housing structure and comprises a bevel edge inclined relative to the connecting portion and extending away from the sliding part, and when the handle is pulled forward, the resisting surface urges the bevel edge to cause the locking part to deform inward; and
a handle, slidably passing through the housing structure and fixed to the sliding part;
wherein when the handle is pulled forward, the handle drives the sliding part towards the locking part, and the resisting portion urges the latching portion and causes the latching portion to elastically deform inward and disengage from the clapboard, such that the housing structure is removable from the receiving portion.

9. The communication apparatus of claim 8, wherein the housing structure comprises a bottom board and a pair of side boards perpendicularly extending from two sides of the bottom board to be parallel with each other, and the bottom board and the pair of side boards collectively form a receiving space to receive an electronic device.

10. The communication apparatus of claim 9, wherein the sliding part further comprises a sliding portion abutting against the bottom board, and the resisting portion is perpendicularly bent from one side of the sliding portion and abuts against a corresponding one of the side boards in a position contiguous with the guiding portion, whereby the sliding part is stably slidable in the receiving space.

11. The communication apparatus of claim 10, wherein the housing structure further comprises a front board perpendicularly extending from the bottom board to interconnect the pair of side boards, and the locking part is fixed to the corresponding one of the side boards between the front board and the sliding part.

12. The communication apparatus of claim 11, wherein the front board defines a pair of first through holes, the sliding part further comprises an urging portion bent from the sliding portion to be parallel with the front board, the urging portion defines a pair of second through holes opposite to the corresponding first through holes, and the handle passes through the pair of first through holes and the pair of second through holes and is securely mounted on the urging portion.

13. The communication apparatus of claim 12, wherein the locking assembly further comprises an elastic element received in the receiving space and resisting between the front board and the sliding part to elastically connect the housing structure with the sliding part.

14. The communication apparatus of claim 13, wherein the front board comprises a first protruding portion protruding into the receiving space, the urging portion comprises a second protruding portion protruding towards the front board, and two ends of the elastic element are respectively fixed on the first protruding portion and the second protruding portion.

15. The communication apparatus of claim 8, further comprising an enclosure and another clapboard, wherein the clapboards protrude from the enclosure and are spaced from each other to define the receiving portion.

16. A locking assembly for installing an electronic component into or removing the electronic component out from a communication apparatus having an enclosure defining at least one locking hole, the locking assembly comprising:
a housing structure comprising a bottom board, two side boards defining at least one latching hole corresponding to the at least one locking hole, and a front board;
a handle, slidably passing through the front board;
at least one locking part comprising a latching portion, the at least one locking part fixed to at least one of the side boards, the latching portion defining a bevel edge, and the latching portion passing through the at least one latching hole and the at least one locking hole to lock the locking assembly in the enclosure with the guiding portion;
a sliding part connected with the handle and movably mounted in the housing structure comprising a resisting portion and a sliding portion, the resisting portion is perpendicularly bent from one side of the sliding portion, wherein the resisting portion comprises a resisting surface facing the locking part, and when the handle is pulled forward, the resisting surface urges the bevel edge of the latching portion to cause the locking part to deform inward; and
an elastic element disposed between the sliding part and the front board.

17. The locking assembly of claim 16, wherein the handle defines a pair of screwing holes respectively located in the two ends of the handle, the sliding part further comprise a urging portion, the urging portion is perpendicularly bent from the sliding portion and defines a pair of through holes and comprises a protruding portion, and the pair of through holes are opposite to the pair of screwing holes to provide for engagement of the sliding part with the handle.

18. The locking assembly of claim 16, wherein the protruding portion is located between the pair of through holes, and the elastic element is received in the protruding portion.

19. The locking assembly of claim 16, wherein the at least one locking part further comprises a plurality of fixing holes, and fastening parts such as screws pass through the fixing holes to fasten the at least one locking part on the to the at least one of the side boards.

* * * * *